(12) United States Patent
Seto

(10) Patent No.: US 12,027,452 B2
(45) Date of Patent: Jul. 2, 2024

(54) INTERCONNECTION SUBSTRATE, SEMICONDUCTOR PACKAGE, AND METHOD OF MANUFACTURING INTERCONNECTION SUBSTRATE

(71) Applicant: KIOXIA CORPORATION, Tokyo (JP)

(72) Inventor: Motoshi Seto, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 244 days.

(21) Appl. No.: 17/459,349

(22) Filed: Aug. 27, 2021

(65) Prior Publication Data

US 2022/0293502 A1    Sep. 15, 2022

(30) Foreign Application Priority Data

Mar. 12, 2021    (JP) ................................ 2021-040554

(51) Int. Cl.
     *H01L 23/498*      (2006.01)
     *H01L 23/00*      (2006.01)
     *H01L 25/065*      (2023.01)

(52) U.S. Cl.
     CPC .. *H01L 23/49816* (2013.01); *H01L 23/49827* (2013.01); *H01L 24/48* (2013.01); *H01L 25/0657* (2013.01); *H01L 24/32* (2013.01); *H01L 2224/32145* (2013.01); *H01L 2224/48225* (2013.01); *H01L 2225/06506* (2013.01); *H01L 2225/0651* (2013.01); *H01L 2225/06562* (2013.01)

(58) Field of Classification Search
     CPC .............. H10B 80/00; H01L 23/49816; H01L 23/49827; H01L 24/48; H01L 25/0657
     USPC .......................................................... 257/773
     See application file for complete search history.

(56) References Cited

U.S. PATENT DOCUMENTS

| | | | |
|---|---|---|---|
| 8,545,688 B2 | 10/2013 | Nishikiori et al. | |
| 8,890,312 B2 * | 11/2014 | Yuen | H01L 23/373 257/712 |
| 8,951,401 B2 | 2/2015 | Nishikiori et al. | |
| 9,099,539 B2 * | 8/2015 | Tuttle | H01L 25/0657 |
| 2012/0299193 A1 | 11/2012 | Shibuya | |
| 2019/0318984 A1 | 10/2019 | Kim | |

FOREIGN PATENT DOCUMENTS

| | | |
|---|---|---|
| JP | 2000228425 A | 8/2000 |
| JP | 4756132 B2 | 8/2011 |
| JP | 5112010 B2 | 1/2013 |
| JP | 2018175789 A | 11/2018 |
| TW | 201944869 A | 11/2019 |

OTHER PUBLICATIONS

Entrusted I'MSEP Co., Ltd., Trustee Kinki Bureau of Economy, Trade and Industry, "Innovative carbon plating technology", R & D results report, 2009 Strategic Basic Technology Advancement Support Project, Mar. 2010, 59 pages (with translation).

\* cited by examiner

*Primary Examiner* — Jasmine J Clark
(74) *Attorney, Agent, or Firm* — Kim & Stewart LLP

(57) ABSTRACT

According to one embodiment, an interconnection substrate includes an insulating layer. A first interconnection layer is on a first side of the insulating layer. A second interconnection layer is on a second side of the insulating layer, which is opposite the first side. A first film comprising carbon covers at least part of the first and second interconnection layers.

14 Claims, 11 Drawing Sheets

10

INTERCONNECTION SUBSTRATE, SEMICONDUCTOR PACKAGE, AND METHOD OF MANUFACTURING INTERCONNECTION SUBSTRATE

CROSS-REFERENCE TO RELATED APPLICATION

This application is based upon and claims the benefit of priority from Japanese Patent Application No. 2021-040554, filed Mar. 12, 2021, the entire contents of which are incorporated herein by reference.

FIELD

Embodiments described herein relate generally to an interconnection substrate, a semiconductor package, and a method of manufacturing an interconnection substrate.

BACKGROUND

An interconnection board in an electrical device or various semiconductor device packages employs an interconnection substrate. When the electrical device or the semiconductor device package is used in different environments, a metal used in the interconnection substrate may migrate from the substrate.

DETAILED DESCRIPTION

Embodiments provide an interconnection substrate and a semiconductor package capable of preventing migration of an interconnection material.

In general, according to one embodiment, an interconnection substrate includes an insulating layer. A first interconnection layer is on a first side of the insulating layer. A second interconnection layer is on a second side of the insulating layer, which is opposite the first side. A first film comprising carbon covers at least part of the first and second interconnection layers.

Certain example embodiments according to the present disclosure will be described with reference to the drawings. It is to be noted that the example embodiments are not intended to limit the scope of the present disclosure. In general, the drawings are schematic or conceptual and depicted proportions and dimensions of elements and aspects are not necessarily identical to actual dimensions and proportions. In the specification, elements and/or aspects previously described for one embodiment may be denoted by the same reference symbols in description of subsequent embodiments and detailed descriptions of such repeated elements and/or aspects may be omitted from subsequent description(s).

First Embodiment

Figure 1A:
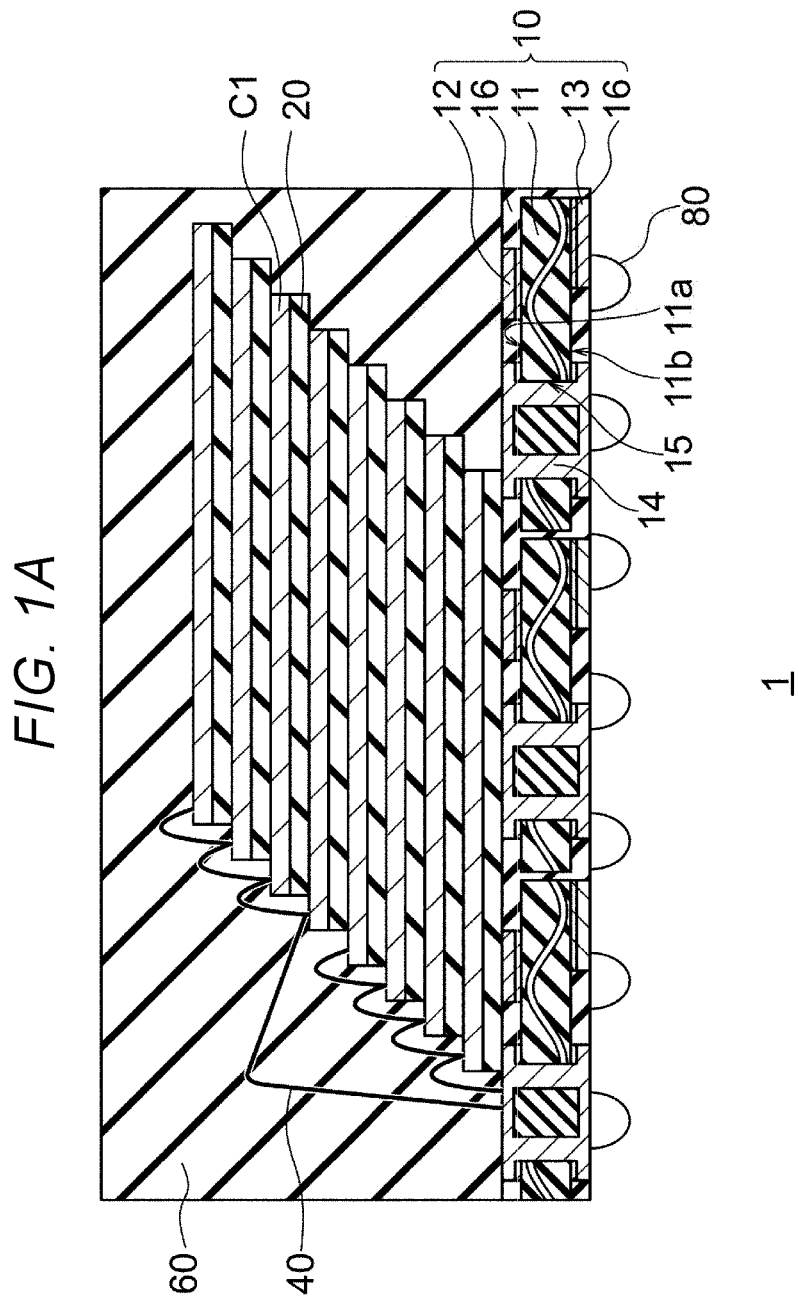
FIG. 1A is a cross-sectional view of a semiconductor package according to a first embodiment.

FIG. 1A is a schematic cross-sectional view showing an example of a semiconductor package 1 according to a first embodiment. The semiconductor package 1 according to the first embodiment includes an interconnection substrate 10, semiconductor chips Cl, metal wires 40, resin layers 20 and 60, and metal bumps 80.

The interconnection substrate 10 comprises an insulating layer 11, interconnection layers 12, 13, and 14, and a solder resist 16. The interconnection layer 12 is provided on a first surface 11a of the insulating layer 11. The interconnection layer 13 is provided on a second surface 11b opposite to the first surface 11a. The insulating layer 11 is provided between the interconnection layers 12 and 13. Through-holes 15 may be provided in the insulating layer 11. In this case, the interconnection layers 12 and 13 are electrically connected to each other via the interconnection layer 14 (also referred to as a through-hole connector, a via connector, an interlayer interconnection, or the like) provided within a through-hole 15. For example, an insulating material such as glass epoxy resin is used for the insulating layer 11. For example, a low resistance metal material such as copper is used for the interconnection layers 12 to 14.

The plurality of semiconductor chip Cl are stacked on a first surface, closer to the first surface 11a of the insulating layer 11, of the interconnection substrate 10. The plurality of semiconductor chips Cl are each adhesively bonded onto the solder resist 16 in the interconnection substrate 10 or onto the other semiconductor chip Cl using an adhesive agent such as a DAF, (Die Attach Film). A metal wire 40 is bonded from a pad of a semiconductor chip Cl to the interconnection layer 12 and electrically connects the pad to the interconnection layer 12. A plurality of metal wires 40 can be provided for the plurality of semiconductor chips Cl. Likewise, semiconductor chips Cl can be electrically connected to another semiconductor chip Cl via bonding wires corresponding to a metal wire 40 or the like.

The semiconductor chips Cl and the metal wires 40 are covered with the resin layer 60. An insulating resin material is used for the resin layer 60.

The metal bumps 80 are provided on a second surface, closer to the second surface 11b of the insulating layer 11, of the interconnection substrate 10. The metal bumps 80 are electrically connected to the interconnection layer 13. The metal bumps 80 electrically connect other substrates and/or apparatuses to the interconnection layer 13. For example, a low resistance metal material such as a solder is used for the metal bumps 80.

Figure 1B:
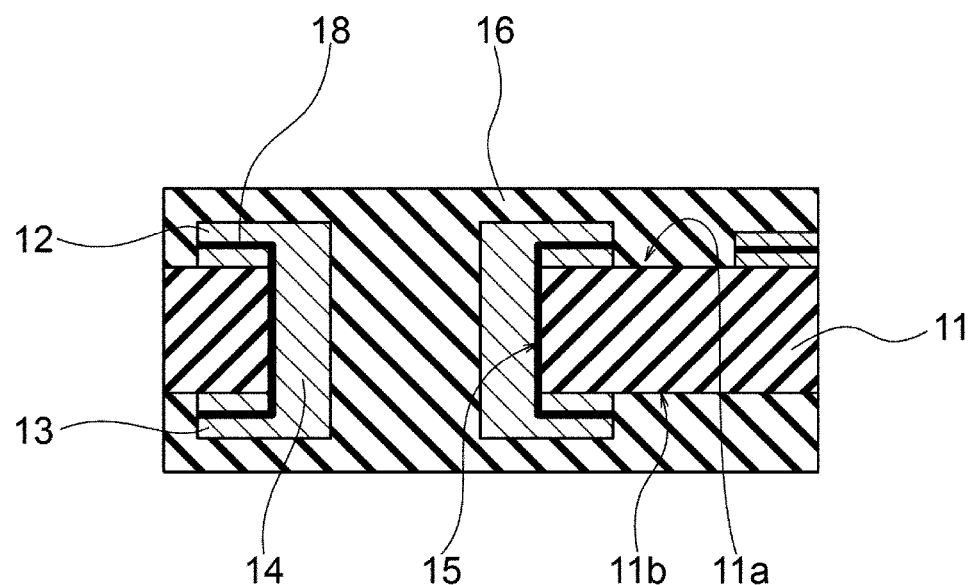
FIG. 1B is an enlarged cross-sectional view of portions of an interconnection substrate.

FIG. 1B is an enlarged cross-sectional view showing an example of portions of the interconnection substrate 10. The interconnection substrate 10 has a carbon film 18 provided within the interconnection layers 12 to 14. The carbon film 18 covers at least part of the interconnection layers 12 to 14. The carbon film 18 functions as a barrier film and is capable of preventing diffusion of materials. For example, the carbon film 18 prevents a metal such as copper which forms the interconnection layers 12 to 14 from diffusing. The carbon film 18 preferably covers the interconnection layers 12 to 14 to the extent possible without affecting processing. The carbon film 18 is, for example, a film containing or comprising carbon and may be formed by a plating method or other deposition methods. For example, the carbon film 18 may be a substantially pure carbon film in some instances formed by an electrochemical plating process or otherwise.

Carbon is higher in ionization tendency than the metal (such as copper) used in the interconnection layers 12 to 14.

Furthermore, carbon is a low-cost material compared with metal materials such as titanium nitride (TiN), tantalum nitride (TaN), gold, or platinum, thus generally use of carbon with the interconnection layers does not cause a cost increase in the manufacturing of an interconnection substrate. Moreover, carbon may be formed into a film by a plating technique (e.g., an electrochemical plating process, such as a molten salt electrochemical process) and also has excellent water resistance and electric conductivity. Therefore, covering the interconnection layers 12 to 14 with the carbon film 18 makes it possible to prevent diffusion from the interconnection layers 12 to 14 without impairing the electrical conductivity of the interconnection layers 12 to 14. Furthermore, it is possible to prevent passage of water by use of the carbon film 18. It is thereby possible to prevent corrosion of the interconnection layers 12 to 14.

FIGS. 2A to 8B depict aspects related to an example of a method of manufacturing the interconnection substrate 10 according to the first embodiment. It is noted that FIGS. 2A to 8A show cross-sections and FIGS. 2B to 8B show plan views.

Figure 2A:
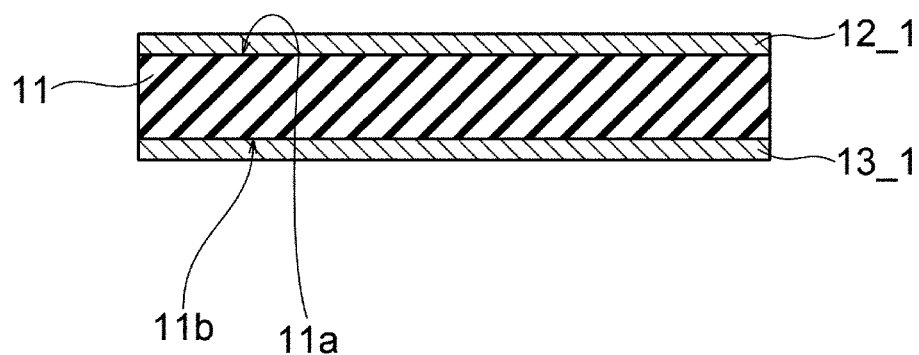
FIGS. 2A to 8B depict aspects of a method of manufacturing an interconnection substrate according to the first embodiment.
Figure 2B:
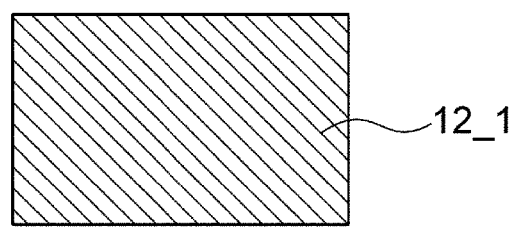

First, as shown in FIGS. 2A and 2B, material films 12_1 and 13_1 are formed on the first surface 11a and the second surface 11b of the insulating layer 11. The insulating layer 11 serves as a core. For example, a metal material such as copper is used for the material films 12_1 and 13_1. The material films 12_1 and 13_1 may be formed using a sputtering method, a plating method, or the like. Thicknesses of the material films 12_1 and 13_1 are each, for example, 10 μm. The material films 12_1 and 13_1 constitute part of the interconnection layers 12 and 13, respectively.

Figure 3A:
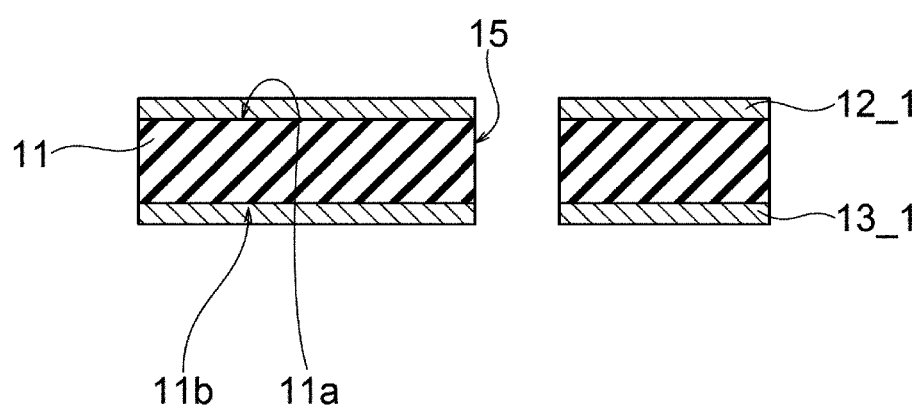
Figure 3B:
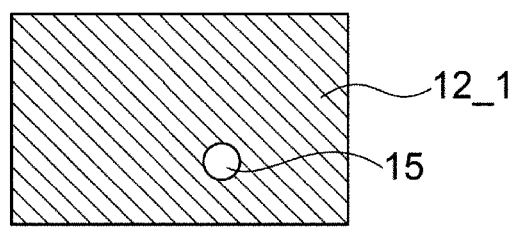

Next, as shown in FIGS. 3A and 3B, through-holes 15 are formed in the insulating layer 11 and the material films 12_1 and 13_1, as needed. Each through-hole 15 is formed in such a manner as to penetrate between the first surface 11a and the second surface 11b of the insulating layer 11. A through-hole 15 may be formed using a lithography technique and an etching technique or may be formed using a laser beam machining method.

Figure 4A:
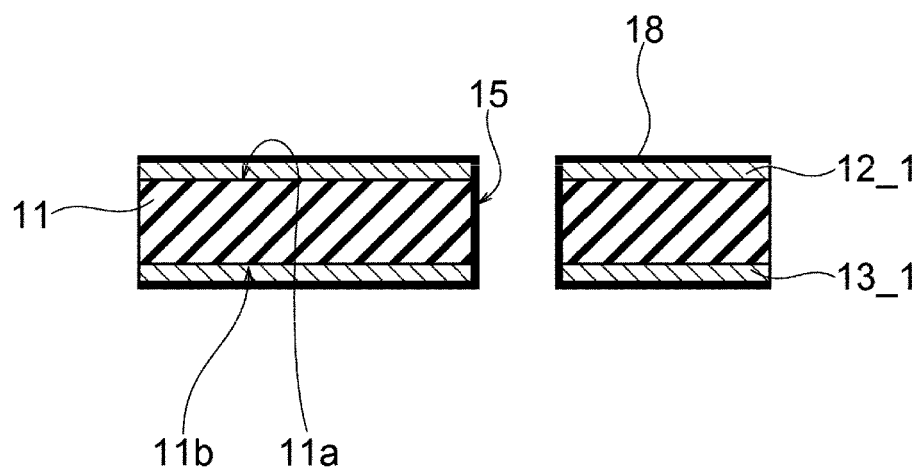
Figure 4B:
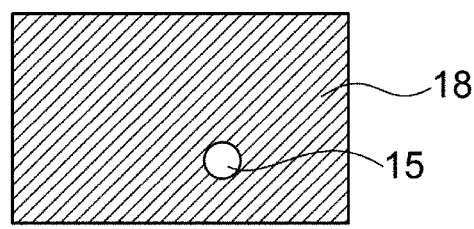

Next, as shown in FIGS. 4A and 4B, a carbon material is formed on the insulating layer 11 using a plating method. Thus, a carbon film 18 is formed on the material film 12_1 on the first surface 11a, the material film 13_1 on the second surface 11b, and an inner surface of the through-holes 15. A thickness of the carbon film 18 is, for example, 1 micron (μm). The carbon film 18 covers surfaces of the material films 12_1 and 13_1. As noted above, the carbon film 18 has a higher ionization tendency than a metal such as copper and excellent water resistance and electric conductivity. Therefore, the carbon film 18 is capable of preventing migration from and corrosion of the material films 12_1 and 13_1 yet does not substantially impair the electric conductivity of the material films 12_1 and 13_1.

Figure 5A:
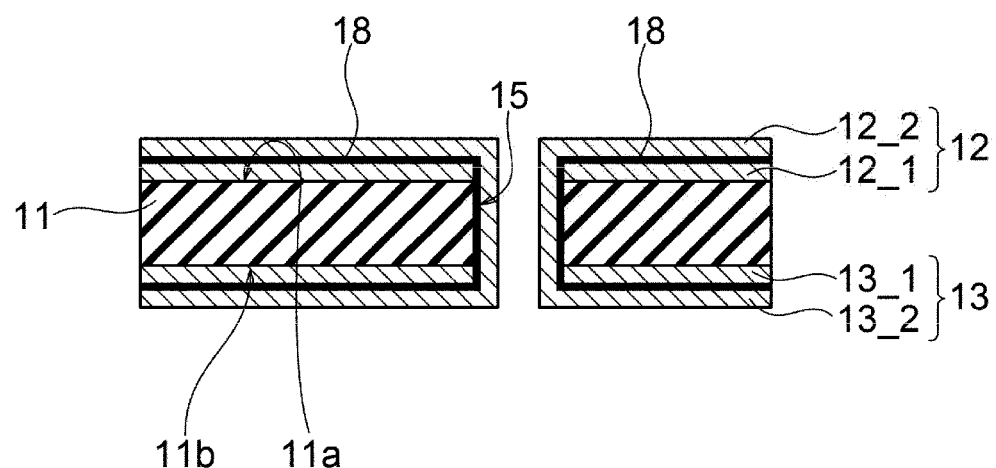
Figure 5B:
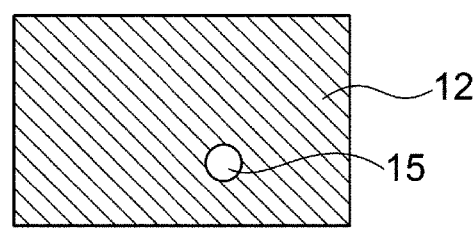

Next, as shown in FIGS. 5A and 5B, material films 12_2 and 13_2 are formed on the carbon film 18 using a sputtering method, a plating method, or the like. For example, a metal material such as copper is used for the material films 12_2 and 13_2 similarly to the material films 12_1 and 13_1. Thicknesses of the material films 12_2 and 13_2 are each, for example, 5 μm. The material films 12_2 and 13_2 like the material films 12_1 and 13_1 serve as materials of the interconnection layers 12 and 13, respectively. The carbon film 18 is between the material films 12_1 and 12_2 and between the material films 13_1 and 13_2. However, the carbon film 18 does not significantly impair electric conductivity between the material films 12_1 and 12_1 or between the material films 13_1 and 13_2 since the carbon film 18 is electric conductive. That is, the material films 12_1 and 12_2 still are capable of functioning as an integrated interconnection layer 12. In addition, the material films 13_1 and 13_2 are similarly capable of functioning as an integrated interconnection layer 13. The material films 12_1 and 12_2 will be also referred to collectively as "interconnection layer 12," and the material films 13_1 and 13_2 will be also referred to collectively as "interconnection layer 13".

Figure 6A:
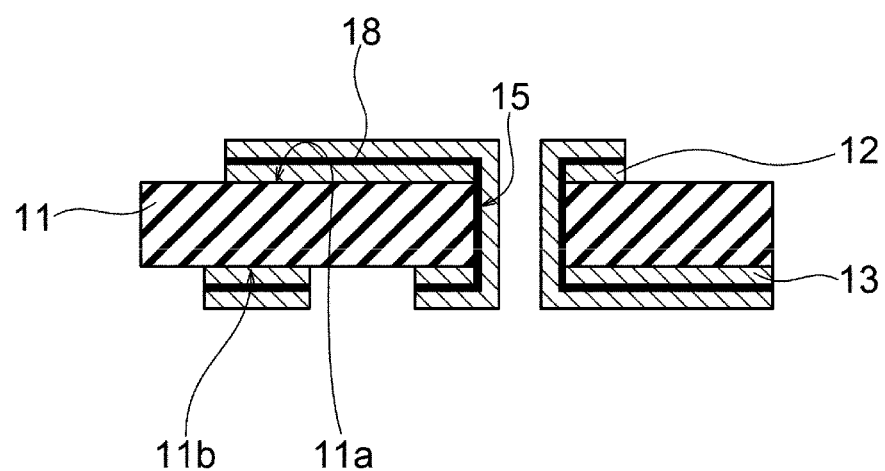
Figure 6B:
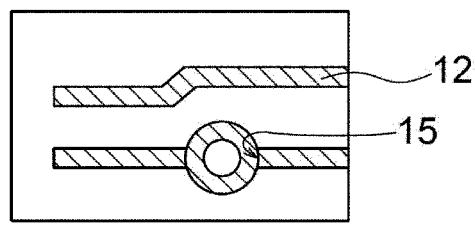

Next, as shown in FIGS. 6A and 6B, the interconnection layers 12 and 13 are patterned into the desired interconnection patterns using a lithography and etching technique. During this processing, portions of the carbon film 18 as along with the interconnection layers 12 and 13 are removed in the forming of the interconnection pattern(s).

Figure 7A:
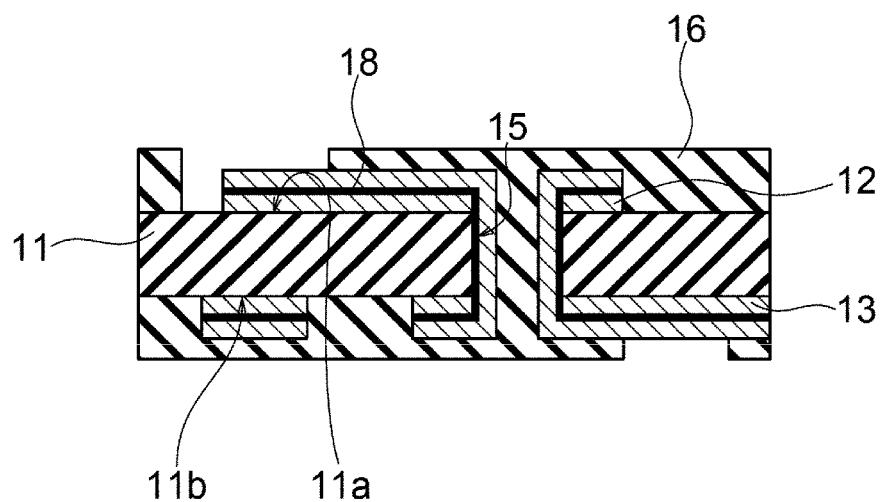
Figure 7B:
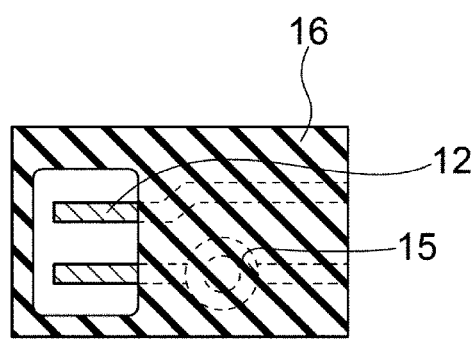

Next, as shown in FIGS. 7A and 7B, solder resist 16 is formed on the first surface 11a and the second surface 11b of the insulating layer 11. Solder resist 16 also fills each through-hole 15. The solder resist 16 can be patterned using lithography and etching techniques. The solder resist 16 is patterned in such a manner as to expose contact regions of the interconnection layers 12 and 13 and to cover other regions.

Figure 8A:
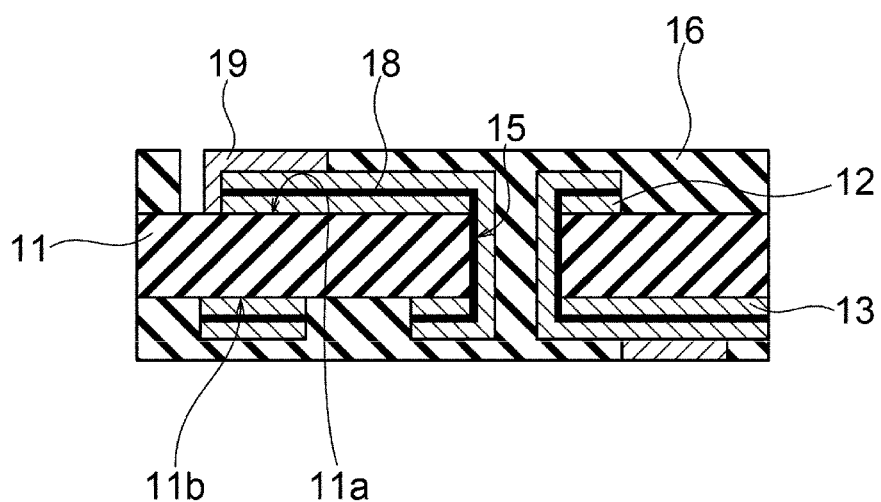
Figure 8B:
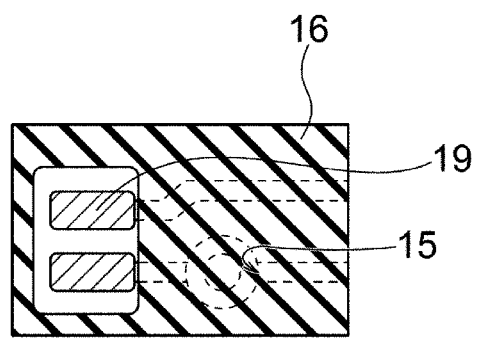

Next, as shown in FIGS. 8A and 8B, a contact film 19 is formed on the contact regions exposed by the solder resist 16 using a sputtering method, a plating method, or the like. For example, a low electrical resistance metal material such as gold or nickel is used for the contact film 19.

The interconnection substrate 10 is thereby completed.

As shown in FIG. 1A, in a case of using the interconnection substrate 10 in the semiconductor package 1, one semiconductor chip Cl is adhesively bonded directly to the interconnection layer 12 and the solder resist 16 of the interconnection substrate 10 using the resin layer 20. Another semiconductor chip Cl is adhesively bonded onto the first semiconductor chip Cl using a resin layer 20. The semiconductor chips Cl are, for example, memory chips. A plurality of semiconductor chips Cl are arranged, for example, in a staggered manner such that pads of the semiconductor chips Cl do not overlap those of the semiconductor chips Cl below.

Next, the pads of the semiconductor chips Cl are electrically connected to a contact film 19 on the interconnection board 10 by the metal wires 40.

Next, the semiconductor chips Cl and the metal wires 40 on the interconnection substrate 10 are covered with the resin layer 60. The resin layer 60 thereby seals and protects the semiconductor chips Cl and the metal wires 40. The semiconductor package 1 shown in FIG. 1 is thereby completed.

At least part of the interconnection layers 12 and 13 of the interconnection substrate 10 according to the first embodiment are covered with carbon film 18.

It is noted that the carbon film 18 in the first embodiment particularly covers the material films 12_1 and 13_1 that constitute a sub-part of the interconnection layers 12 and 13. However, a carbon film 18 may cover the material films 12_2 and 13_2 as an alternative to or in addition to the material films 12_1 and 13_1. It thereby may be possible to further prevent migration and/or corrosion of the interconnection layers 12 and without impairing the electric conductivity of the interconnection layers 12 and 13.

Second Embodiment

Figure 9:
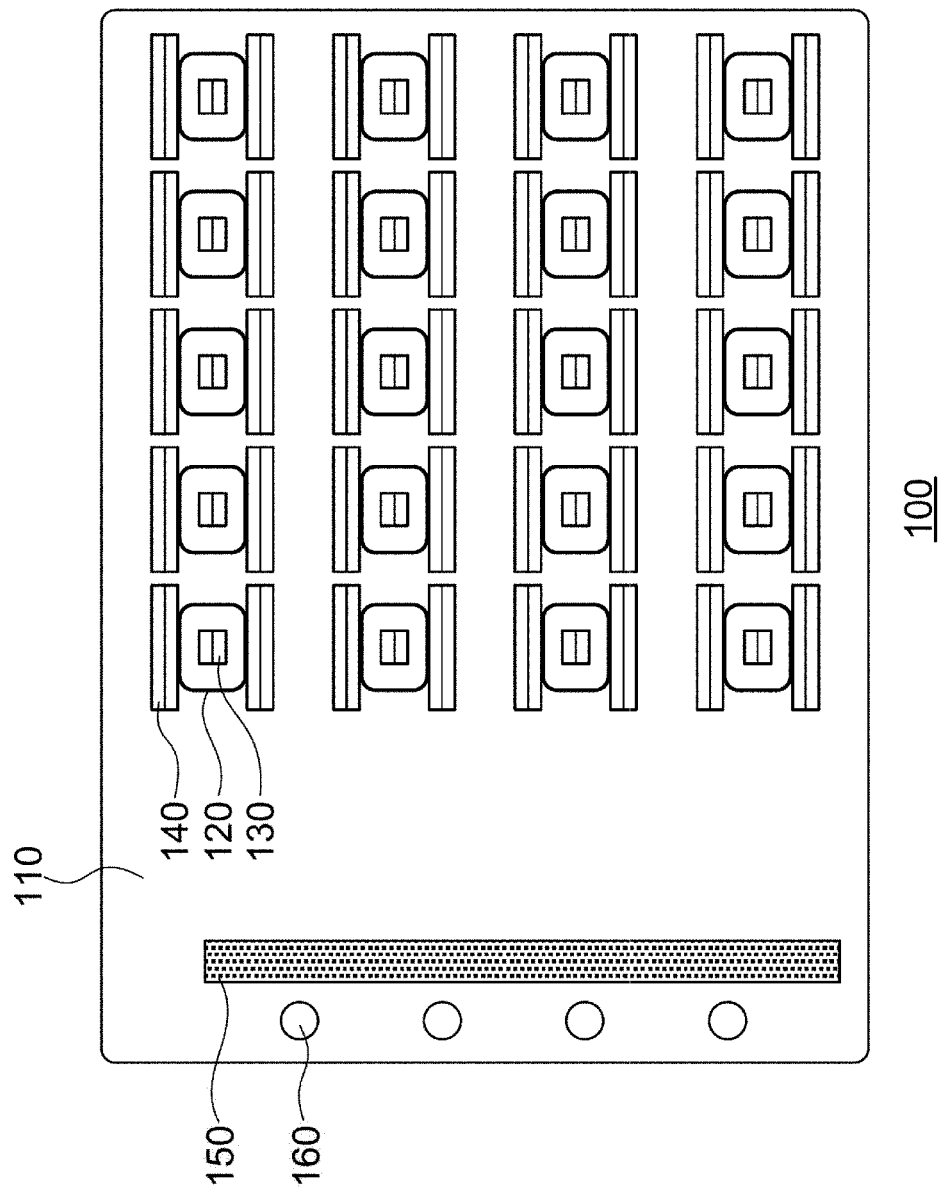
FIG. 9 is a plan view of an interconnection board according to a second embodiment.

FIG. 9 is a plan view showing an example of an interconnection board 100 according to a second embodiment.

The interconnection board 100 is, for example, a mother board of a reliability test device for performing a reliability test such as a HAST test (Highly Accelerated Steam and Temperature test) on a DUT (Device Under Test). Overall configurations of a reliability test device will be described with reference to FIG. 10. In a reliability test, a user mounts at least one DUT on the interconnection board 100 and sets test conditions for the surrounding atmosphere (such as a temperature and a humidity level) for the DUT (s) which are mounted in sockets or the like on the interconnection board 100. The reliability test device then measures characteristics of the DUTs. It is thereby possible to evaluate reliability of the DUTs under accelerated conditions. Each DUT may be, for example, a semiconductor package 1 such as depicted in FIG. 1A.

The interconnection board 100 for use in such a reliability test is exposed to a similar atmosphere to that in which the DUT is placed. Therefore, migration, degradation, and the like of the material of the interconnection layers within the interconnection board 100 may itself adversely affect the reliability testing. In the second embodiment, similar configurations to those of the interconnection substrate 10 according to the first embodiment are applied to the interconnection board 100.

The interconnection board 100 comprises an interconnection substrate 110, sockets 120, connectors 130, interconnection sections 140, a board connector 150, and board terminals 160. In general, the interconnection substrate 110 has basically an identical structural configuration as that of the interconnection substrate 10 (described with reference to FIG. 1B), however there are differences in scale. Like that shown in FIG. 1B, the carbon film 18 covers at least part of the interconnection layers 12 to 14 within the interconnection substrate 110. The carbon film 18 prevents diffusion of the metal such as copper configuring the interconnection layers 12 to 14. The carbon film 18 comprises carbon and may be formed by a plating method.

Each socket 120 serves as a mount section and is provided on the solder resist 16. Each socket 120 has a frame-like or bowl-like shape matching or slightly larger than an outer shape of a DUT. The sockets 120 are for fixing the DUTs to a predetermined location on the interconnection substrate 110. For example, an insulating material such as a resin is used for the socket 120. Fitting the DUT into a socket 120 makes it possible to physically mount the DUT on the interconnection substrate 110. Furthermore, fitting the DUT in the socket 120 also makes it possible to fix a location of the DUT relative to the interconnection board 100 and to measure the characteristics of the DUT.

Each connector 130 is provided at the bottom portion of a socket 120 and electrically connected to the interconnection layers 12 and 13 (shown in FIG. 1B). The connector 130 is provided with connector positions corresponding to each terminal of the DUT. Upon attaching the DUT in the socket 120, the terminals, (e.g., a bump 80 shown in FIG. 1) of the DUT are electrically connected to a corresponding connector portion of a connector 130.

The interconnection sections 140 are resistance elements (resistors) connected between the connectors 130 and the board connector 150 to prevent an excessive current from passing between the connectors 130 and the board connector 150.

The board connector 150 is a connector for electrically connecting terminals of the reliability test device 200 (shown in FIG. 10) or another device (e.g., a computer or other external device) to a DUT mounted on the interconnection board 100 when the interconnection board 100 is attached into the reliability test device 200. An external device or reliability test device 200 itself measures electrical characteristics of the DUT. The board connector 150 can be electrically connected to any of the interconnection layers 12 to 14. The board connector 150 can be used for supplying a control signal from the outside to the DUTs and/or electrical power to the DUTs or for outputting a signal from a DUT to the outside.

Each board terminal 160 is an electrode for making electrical connections to the reliability test device 200 or an external device when the interconnection board 100 is attached into the reliability test device 200. The board terminals 160 are similar to the board connector 150. The board connector 150 and the board terminals 160 can serve as measuring terminals for measuring the electrical characteristics of the DUTs within a chamber 210 of the reliability test device 200.

Figure 10:
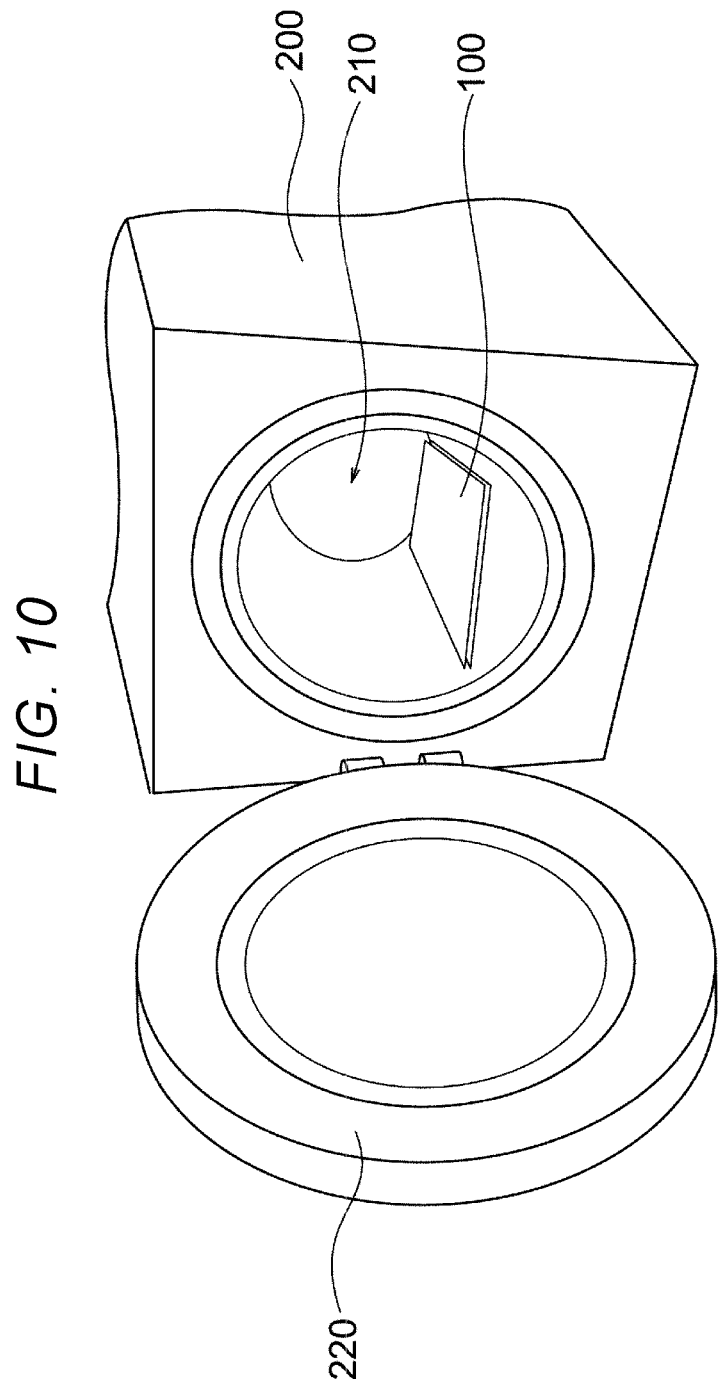
FIG. 10 is a schematic external view of a reliability test device.

FIG. 10 is a schematic external view showing an example of a reliability test device 200. The reliability test device 200 has a chamber 210 and a lid section 220. The chamber 210 is provided inside a main body section and is capable of accommodating therein the interconnection board 100. The chamber 210 may be capable of accommodating a plurality of interconnection boards 100. The lid section 220 is configured to be capable of opening/closing the opening of the chamber 210. Closing the lid section 220 enables the interior of the chamber 210 to be hermetically sealed. The reliability test device 200 includes a heater, a cooling system, a humidifier, and the like, and is capable of changing the conditions such as the temperature and the humidity for the surrounding atmosphere of the interconnection board 100. The reliability test device 200 is thereby capable of executing a reliability test (e.g. a HAST test) with the interconnection board 100 at high temperature in a high humidity atmosphere.

Next, a method of manufacturing the interconnection board 100 will be described.

A method of manufacturing the interconnection substrate 110 may be considered to be basically the same as the method of manufacturing the interconnection substrate 10 according to the first embodiment.

Each socket 120 is fitted onto the solder resist, such as the solder resist 16 shown in FIG. 1B which is formed on the interconnection substrate 110. Next, connectors 130 electrically connected to the interconnection layers 12 and 13 are provided in the sockets 120. Next, the board connector 150 and each board terminal 160 are formed on the interconnection substrate 110. In this way, the interconnection board 100 is completed.

At least part of the interconnection layers 12 and 13 (refer to FIG. 1B) in the interconnection board 100 according to the second embodiment are covered with the carbon film 18, similarly to those in the interconnection board 10 according to the first embodiment. Therefore, the carbon film 18 is capable of preventing migration and corrosion of the interconnection layers 12 and 13 yet does not substantially impair the electric conductivity of the interconnection layers 12 and 13. Furthermore, the use of the carbon film 18 does not cause a significant cost increase in the interconnection board 100 since the carbon film 18 is generally a low-cost material.

It is noted that the carbon film 18 may cover the material films 12_2 and 13_2 as an alternative to, or in addition to, the material films 12_1 and 13_1 in the second embodiment similarly to the first embodiment. It is thereby possible to further prevent migration and corrosion of the interconnection layers 12 and 13 without impairing the electric conductivity of the interconnection layers 12 and 13.

For example, using the interconnection board 100 according to the second embodiment, a test was executed on the semiconductor package 1 of a BGA (Ball Grid Array) type. The internal temperature of the chamber 210 was set to approximately 110° C. and the internal humidity was set to approximately 85%.

If the interconnection board 100 did not have a carbon film 18 and the HAST was approximately 1,000 hours long, it would generally be necessary to replace the interconnection board 100 after the HAST.

When interconnection board 100 has the carbon film 18 as in the case of the interconnection board 100 according to the present embodiment, the interconnection board 100 experiences less degradation and it is unnecessary to replace the interconnection board 100 even after 1,000 hours long HAST. Thus, applying the carbon film 18 to the interconnection board 100 makes it possible to extend the life of the interconnection board 100.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An interconnection substrate, comprising:
   an insulating layer;
   a first interconnection layer on a first side of the insulating layer;
   a second interconnection layer on a second side of the insulating layer, the second side being opposite the first side; and
   a first film comprising carbon and covering at least part of the first and second interconnection layers.

2. The interconnection substrate according to claim 1, wherein
   the first and second interconnection layers each comprise copper.

3. The interconnection substrate according to claim 2, further comprising:
   a mount section on the first interconnection layer for a semiconductor package;
   a connector in the mount section configured to electrically contact the semiconductor package, the connector being electrically connected to at least one of the first and second interconnection layers; and
   a measuring terminal for electrically connecting an external device to the connector via at least one of the first and second interconnection layers.

4. The interconnection substrate according to claim 1, further comprising:
   a mount section on the first interconnection layer for a semiconductor package;
   a connector in the mount section configured to electrically contact the semiconductor package, the connector being electrically connected to at least one of the first and second interconnection layers; and
   a measuring terminal for electrically connecting an external device to the connector via at least one of the first and second interconnection layers.

5. The interconnection substrate according to claim 1, further comprising:
   a through-hole through the insulating layer from the first side to the second side; and
   an interconnector in the through-hole and electrically connecting the first and second interconnection layers.

6. The interconnection substrate according to claim 5, wherein the first film extends through the through-hole.

7. The interconnection substrate according to claim 6, wherein the first film is a continuous film from the first side to the second side.

8. The interconnection substrate according to claim 6, wherein the first film is between the insulating layer and the interconnector.

9. The interconnection substrate according to claim 8, wherein the first film is a carbon film.

10. The interconnection substrate according to claim 1, further comprising:
    a semiconductor chip attached to the first side of the insulating layer;
    a bonding wire electrically connecting the semiconductor chip to the first interconnection layer;
    a solder ball on the second side of the insulating layer, the solder ball being electrically connected to the second interconnection layer; and
    an insulating resin material on the first side of the insulating layer covering the semiconductor chip and the bonding wire.

11. A semiconductor device, comprising:
    an insulating layer having a first surface and a second surface;
    a through-hole in the insulating layer extending from the first surface to the second surface;
    a first metal layer on the first surface of the insulating layer, the first metal layer directly contacting the first surface;
    a second metal layer on the second surface of the insulating layer, the second metal layer directly contacting the second surface;
    a carbon film on the first metal layer and the second metal layer; and
    a metal interconnector portion in the through-hole, wherein
    the first metal layer is between the first surface and the carbon film,
    the second metal layer is between the second surface and the carbon film, and
    the carbon film extends through the through-hole and is continuous from the first surface to second surface.

12. The semiconductor device according to claim 11, wherein the metal interconnector portion includes:
    a first portion on the first surface, the carbon film being between the first portion and the first metal layer,
    a second portion in the through-hole, the carbon film being between the second portion and the insulating layer, and
    a third portion on the second surface, the carbon film being between the third portion and the second metal layer.

13. The semiconductor device according to claim 11, further comprising:
    a semiconductor chip on the first surface, electrically connected to the first metal layer; and
    a solder ball on the second surface, electrically connected to the second metal layer.

14. The semiconductor device according to claim 13, further comprising:

a chip socket on the first surface, the chip socket electrically connecting the semiconductor chip in the chip socket to the first metal layer; and a board terminal on an end portion of the insulating layer, the board terminal being electrically connected to the chip socket via at least one of the first and second metal layers.

* * * * *